US012672466B2

(12) United States Patent
Zou

(10) Patent No.: US 12,672,466 B2
(45) Date of Patent: Jun. 30, 2026

(54) DISPLAY PANEL AND MANUFACTURE METHOD THEREOF

(71) Applicant: Kunshan Go-Visionox Opto-Electronics Co., Ltd., Kunshan (CN)

(72) Inventor: Min Zou, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 1178 days.

(21) Appl. No.: 17/348,039

(22) Filed: Jun. 15, 2021

(65) Prior Publication Data

US 2021/0313541 A1     Oct. 7, 2021

Related U.S. Application Data

(63) Continuation of application No. PCT/CN2019/113691, filed on Oct. 28, 2019.

(30) Foreign Application Priority Data

Apr. 12, 2019    (CN) .......................... 201910296049.9

(51) Int. Cl.
*H10K 59/80*          (2023.01)
(52) U.S. Cl.
CPC ................................. *H10K 59/8722* (2023.02)
(58) Field of Classification Search
CPC ........................ H10K 50/8426; H10K 59/8722
See application file for complete search history.

(56) References Cited

U.S. PATENT DOCUMENTS 6,028,347 A  *  2/2000  Sauber ................ H10W 74/137
                                                                    257/632
10,490,514 B2 *  11/2019  Baek ................... H10W 42/121
                                      (Continued)

FOREIGN PATENT DOCUMENTS

CN            103676298 A      3/2014
CN            104112401 A     10/2014
                                      (Continued)

OTHER PUBLICATIONS

Chinese First Office Action issued on Nov. 19, 2019, in the corresponding CN application (application No. 201910296049.9).
                                      (Continued)

*Primary Examiner* — Fernando L Toledo
*Assistant Examiner* — Jahae Kim
(74) *Attorney, Agent, or Firm* — Quarles & Brady LLP

(57)                ABSTRACT

The present application discloses a display panel including an array substrate, an encapsulation cover plate, an encapsulation layer, and a reinforcement component. The array substrate includes an active area and a non-active area surrounding the active area; the encapsulation layer is disposed between the array substrate and the encapsulation cover plate, and disposed on the non-active area of the array substrate; the encapsulation layer includes an arc-shaped corner; the reinforcement component is disposed between the array substrate and the encapsulation cover plate and disposed outside of the encapsulation layer away from the active area, and the reinforcement component is disposed at one side of the arc-shaped corner away from the active area.

14 Claims, 9 Drawing Sheets

(56)     References Cited

U.S. PATENT DOCUMENTS

| | | | | |
|---|---|---|---|---|
| 2004/0002198 A1* | 1/2004 | Lee | ..................... | H10W 42/121 |
| | | | | 118/728 |
| 2011/0215447 A1* | 9/2011 | Furusawa | ............. | H10W 42/00 |
| | | | | 257/632 |
| 2014/0184059 A1 | 7/2014 | Masuda et al. | | |
| 2014/0312322 A1 | 10/2014 | Jeong et al. | | |
| 2017/0062759 A1 | 3/2017 | Gai et al. | | |
| 2017/0214001 A1 | 7/2017 | Wang et al. | | |
| 2018/0102504 A1 | 4/2018 | Liu et al. | | |
| 2018/0301524 A1 | 10/2018 | Luo et al. | | |

FOREIGN PATENT DOCUMENTS

| | | | | | |
|---|---|---|---|---|---|
| CN | 104766876 A | | 7/2015 | | |
| CN | 105097885 A | | 11/2015 | | |
| CN | 105810849 A | | 7/2016 | | |
| CN | 107507925 A | | 12/2017 | | |
| CN | 108075049 A | | 5/2018 | | |
| CN | 110048020 A | | 7/2019 | | |
| CN | 113036050 A | * | 6/2021 | .............. | G03F 7/00 |
| WO | WO2013172040 A1 | | 11/2013 | | |

OTHER PUBLICATIONS

International Search Report and Written Opinion (International Application No. PCT/CN2019/113691) with English Translation, dated Jan. 22, 2020, 11 pages.
Supplementary Search of CN 201910296049.9 mailed Mar. 6, 2020, 1 page.

\* cited by examiner

100

120

130

140

110

601

630

602

6501

610

650

800

810

830

B

802

801

851

850

DISPLAY PANEL AND MANUFACTURE METHOD THEREOF

CROSS-REFERENCES TO RELATED APPLICATIONS

This application is a bypass continuation application of International Application PCT/CN2019/113691, filed on Oct. 28, 2019, which claims priority to Chinese Patent Application No. 201910296049.9, filed on Apr. 12, 2019, entitled "DISPLAY PANEL AND MANUFACTURE METHOD THEREOF, DISPLAY DEVICE", and the disclosure of both applications are hereby incorporated by reference in their entirety.

TECHNICAL FIELD

This application relates to the display technology field.

BACKGROUND

An Organic Light Emitting Diode (OLED, Organic Light Emitting Diode) hard screen is generally encapsulated with glass frit. In a Frit encapsulation process, usually, a glass material is printed on a cover plate, and is heated and fused by moving a laser spot. After the fused glass material solidifies, the cover plate and an array substrate are closely bonded together.

SUMMARY OF THE INVENTION

In view of a problem that a corner of a display panel is a weak position of the intensity of the display panel, which is caused by the limitation of a chamfer of a laser spot during a frit encapsulation, the present application provides an organic light-emitting display panel capable of enhancing the intensity of the display panel and a manufacturing method thereof.

In order to solve the problem above, the present application provides a display panel, including an array substrate, an encapsulation cover plate, an encapsulation layer, and a reinforcement component;

the array substrate includes an active area and a non-active area surrounding the active area;

the encapsulation layer is disposed between the array substrate and the encapsulation cover plate, and is disposed on the non-active area of the array substrate;

the encapsulation layer includes an arc-shaped corner;

the reinforcement component is disposed between the array substrate and the encapsulation cover plate, and the reinforcement component is disposed at one side of the arc-shaped corner, which is away from the active area.

This application also provides a method for manufacturing a display panel, including:

coating an encapsulation material on an encapsulation cover plate and forming the encapsulation layer and the reinforcement component above;

bonding the encapsulation cover plate and the array substrate; and irradiating the encapsulation layer by a laser.

In the display panel provided by the present application, the reinforcement component is provided at one side of the arc-shaped corner, and the reinforcement component is located between the array substrate and the encapsulation cover plate, thereby avoiding an unsupported area at the corner of the display panel, increasing intensity of the display panel, and reducing risk of damage to the display panel.

The manufacturing method of the display panel provided in the present application adopts related screen printing technology, and the display panel including the reinforcement component can be manufactured only by changing a screen pattern area. The process is simple and easy to implement.

DETAILED DESCRIPTION OF THE EMBODIMENTS

Limited by a chamfer of the laser spot, a frit encapsulation layer is generally arc-shaped at a corner of a display panel. When a shape of the corner of the display panel, such as a right-angle display panel, differs from that of a corner of the encapsulation layer greatly, there is a large unsupported area between an outer edge of the encapsulation layer at the corner thereof and the corner of the display panel, which causes a corner area of the display panel to be a weak position of the intensity of the display panel, increasing the risk of damage to the display panel.

The application will be described in detail below combing with specific embodiments shown in accompanying drawings. However, these embodiments are not intended to limit the present application, and changes in structure, method, or function can be made by those skilled in the art according to these embodiments, and these changes are all included in the protection scope of this application.

Figure 1:
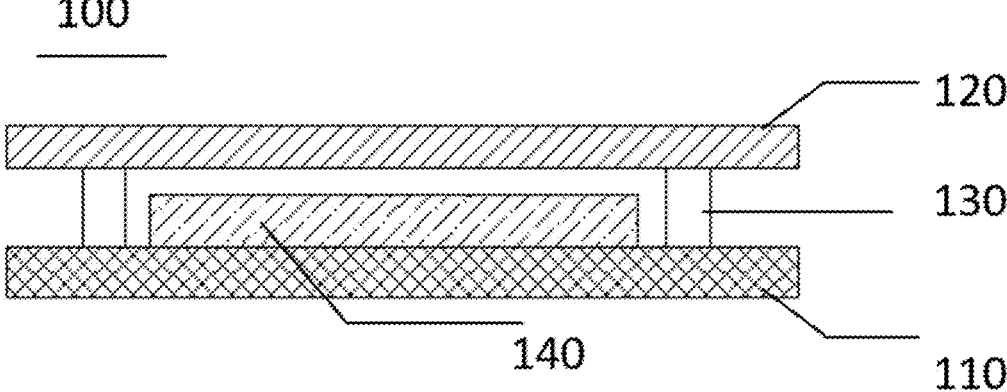
FIG. 1 is a schematic cross-sectional diagram illustrating a structure of a display panel.
Figure 2:
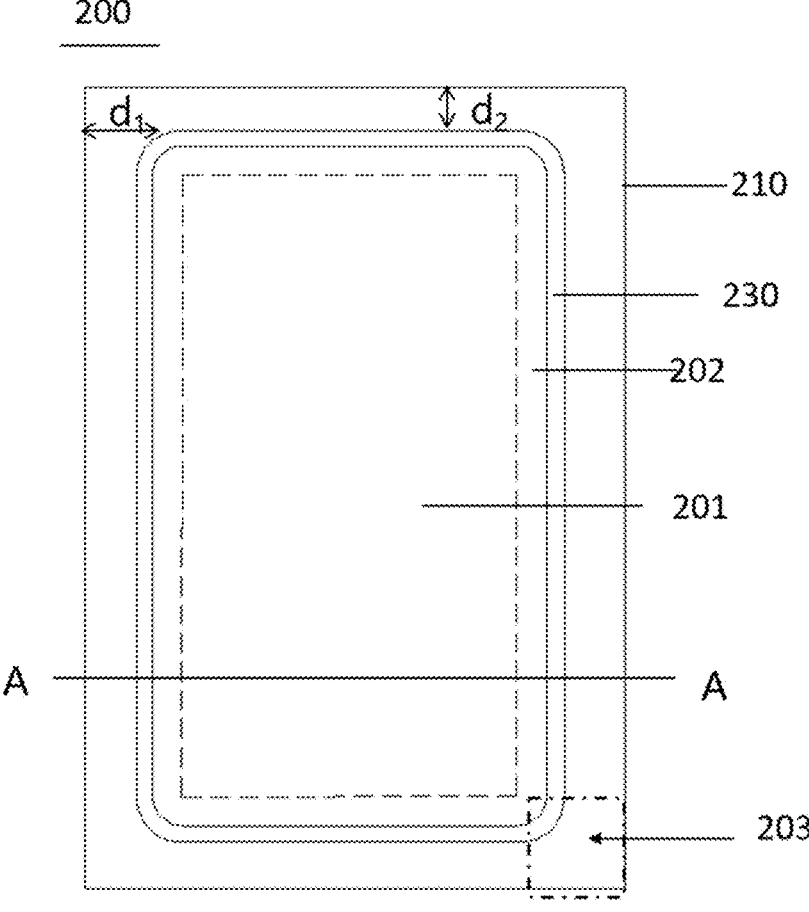
FIG. 2 is a schematic top view illustrating a structure of the display panel.

Taking an OLED display panel as an example, FIG. 1 is a schematic cross-sectional diagram illustrating a structure of the display panel, and FIG. 2 is a schematic top view illustrating a structure of the display panel shown in FIG. 1. FIG. 1 and FIG. 2 provide an OLED display panel encapsulated with Frit. FIG. 1 is a schematic cross-sectional view along an A-A direction in FIG. 2. As shown in FIG. 1, the display panel 100 includes an array substrate 110, an encapsulation cover plate 120, and an encapsulation layer 130.

The encapsulation layer 130 has a first surface in contact with the array substrate 110 and a second surface in contact with the encapsulation cover plate 120; the encapsulation layer 130 is located between the array substrate 110 and the encapsulation cover plate 120. It can be understood that an OLED device 140 is also arranged between the array substrate plate 110 and the encapsulation cover plate 120, and the encapsulation layer 130 is configured to encapsulate the OLED device 140. The encapsulation layer 130 is a Frit encapsulation layer. The Frit encapsulation layer bonds the array substrate 110 and the encapsulation cover plate 120 to form an encapsulation structure. The encapsulation structure prevents external water and oxygen from entering into an OLED light-emitting device structure, thereby improving the life of the OLED device.

As shown in a schematic diagram illustrating the structure of a display panel 200 shown in FIG. 2, the display panel 200 includes an array substrate 210, an encapsulation cover plate (not shown in the figure since a projection of the encapsulation cover plate in the top view direction overlaps the array substrate 210), and an encapsulation layer 230. Where the array substrate 210 includes an active area 201 (a dotted frame area in the figure) and a non-active area 202, and the non-active area 202 surrounds the active area 201. In related Frit encapsulation technology, usually by means of screen printing, the glass material coats a surface of the encapsulation cover plate corresponding to a position of the OLED device, and the glass material (i.e. Frit material) is heated and fused by moving a laser spot, thus making the encapsulation cover plate and the array substrate 210 to be closely bonded together. However, limited by a chamfer of the laser spot, the Frit encapsulation layer 230 is generally arc-shaped at the corner of the display panel 200. An arc-shaped corner area 203 is formed between the arc-shaped corner of the Frit encapsulation layer 230 and a corresponding corner of the display panel 200. The arc-shaped corner area 203 is an area between the array substrate 210 and the encapsulation cover plate, corresponding to the arc-shaped corner of the encapsulation layer 230 and away from the active area 201, that is, an area between the arc-shaped corner of the encapsulation layer 230 and the corresponding corner of the display panel 200. The display panel 200 includes at least one arc-shaped corner area 203. As shown in FIG. 2, a projection of the arc-shaped corner area 203 in a direction perpendicular to the array substrate 210 is a non-active area located at an outer side of the encapsulation layer 230 and corresponding to the arc-shaped corner of the encapsulation layer 230. For a conventional rectangular display panel 200, corners of the display panel 200 are right angles, as shown in FIG. 2. In this case, in directions perpendicular to the projection direction of the array substrate 210, a distance d1 from the encapsulation layer 230 in the arc-shaped corner area 203 to an edge of the array substrate 210 is much greater than a distance d2 from the encapsulation layer 230 in any other area to the edge of the array substrate 210. That is, a relatively large unsupported area is formed between an outer edge of the arc-shaped corner and the corresponding corner of the display panel 200 by the encapsulation layer 230, thus causing the unsupported area at the corresponding corner of the display panel 200 to be a weak position of the intensity of the display panel 200, and increasing risk of damage to the display panel 200.

In this application, the reinforcement component is disposed at the side of the arc-shaped corner, which is away from the active area, that is, the reinforcement component is disposed at a position corresponding to the non-active area located at the outer side of the encapsulation layer and corresponding to the arc-shaped corner, to support the array substrate and the encapsulation cover plate, thereby improving a problem of the larger unsupported area at the corner of the screen display panel caused by the limitation of the chamfer of the laser spot, avoiding low intensity of a local area of the display panel, enhancing the intensity of the display panel, and reducing the risk of the damage to the display panel. It should be understood that a height of the reinforcement component in the embodiments of the application is a height between the array substrate and the encapsulation cover plate after encapsulation. The specific height depends on an actual product, that is, according to the display panel provided by the embodiments of the application, the reinforcement component has an upper surface in contact with the encapsulation cover plate and a lower surface in contact with the array substrate. The reinforcement component is located between the encapsulation cover plate and the array substrate, and supports the encapsulation cover plate and the array substrate.

The reinforcement component may be a single reinforcement block or includes a plurality of reinforcement blocks spaced apart from each other. When the reinforcement component is the single reinforcement block, the reinforcement component is a reinforcement block. It should be understood that when the reinforcement component is the single reinforcement block, a volume of the reinforcement block can be relatively large, which is beneficial to a reduction of the range of the unsupported area, thereby improving the overall intensity of the display panel. Optionally, there are multiple arc-shaped corner areas, that is, there are also multiple arc-shaped corners. Each of the arc-shaped corner areas is provided with a reinforcement component, or reinforcement components are disposed at symmetric arc-shaped corner areas respectively, that is, the reinforcement components are disposed at the sides of the symmetric arc-shaped corners respectively, which are away from the active area. The reinforcement components each disposed of the arc-shaped corner areas respectively can decrease the unsupported area of the display panel maximally, and the reinforcement components arranged symmetrically can ensure uniformity of stress.

The cross section of the reinforcement component has a concave-convex outline, and the concave-convex profile is at least located on one side of the reinforcement component, which is away from the arc-shaped corner. That is, at least the cross-sectional outline of the reinforcement component, which is located at a side proximate to the edge of the display panel, has a concave-convex shape. The cross section of the reinforcement component in this application is a cross section of the reinforcement component, which is parallel to a plane of the encapsulation cover plate. That is, a side surface of the reinforcement component has a protruding portion; an upper surface of the protruding portion is one part of the upper surface of the reinforcement component; and a lower surface of the protruding portion is one part of the lower surface of the reinforcement component. In a manufacturing process of the display panel, after an array segment process is completed, after light-emitting devices are formed, and after the motherboard and the encapsulation cover plate are bonded and encapsulated, the motherboard needs to be cut into some small display panels. However, due to cutting errors during cutting, compared with an originally designed cutting path, an actual cutting path can be farther away from the display panel or closer to the display panel. When the actual cutting line is closer to the display panel than the preset cutting path is, the reinforcement component may be cut. This is especially true for a closely packed motherboard structure. The cross section of the reinforcement component has the concave-convex outline, and the concave-convex outline is at least located at the side of the reinforcement component, which is away from the arc-shaped corner, that is, it is ensured that at least the side of the reinforcement component, which is proximate to the cutting path, is provided with the protruding portion. As the convex portion is provided, when the reinforcement component structure is cut due to an error during the cutting of the motherboard, the convex portion becomes a stress concentration area, which can effectively prevent the reinforcement block body from cracking because of the cutting and avoid affecting the stability of the display panel structure. The convex portion can be a pointed protruding structure, which can further reduce the probability of cutting the reinforcement component on a large scale due to a cutting error, and improve stability of the encapsulation.

Figure 3:
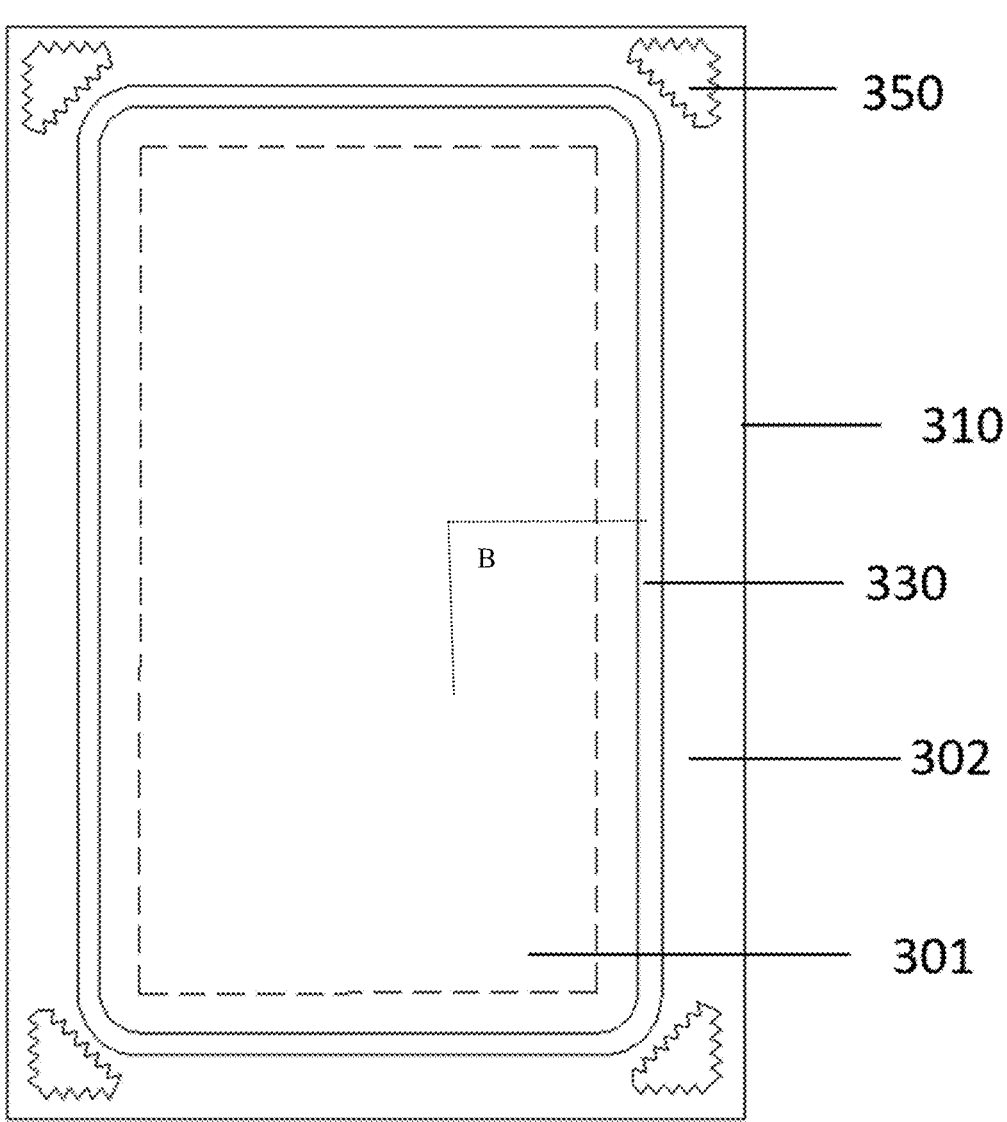
FIG. 3 is a schematic top view illustrating the structure of the display panel according to an embodiment of the present application.

FIG. 3 is a schematic top view illustrating the structure of a display panel according to an embodiment of the present application. In this embodiment, the display panel 300 includes an array substrate 310, an encapsulation cover plate (not shown in the figure), and an encapsulation layer 330; each arc-shaped corner area is provided with a reinforcement component 350, and the reinforcement component 350 is a single reinforcement component. The cross section of the reinforcement block is in a saw-toothed shape 3501. Due to the cutting error, the reinforcement block may be cut. When the cross section of the reinforcement block is in the saw-toothed shape, sharp areas at the edge of the reinforcement block become stress concentration areas, which can effectively prevent the body of the reinforcement block from cracking and avoid affecting the stability of the display panel structure.

Figure 4:
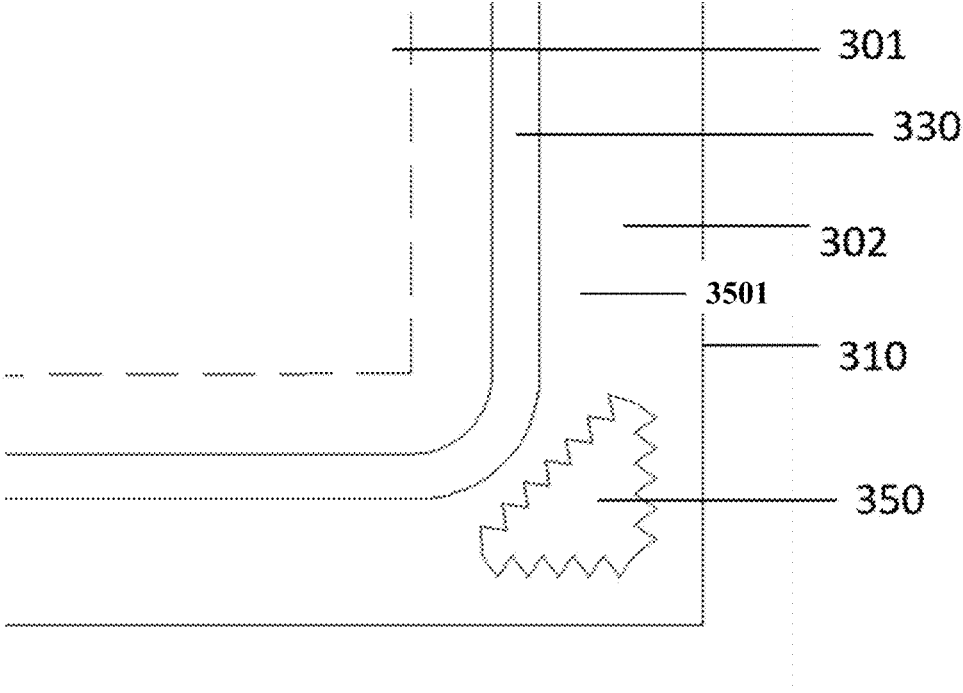
FIG. 4 is a partially enlarged schematic diagram illustrating a structure of a region B of the display panel in FIG. 3 according to an embodiment of the present application.

FIG. 4 is a partially enlarged schematic diagram illustrating a region B in FIG. 3. As can be seen from FIG. 4, the main body of the reinforcement block in this embodiment is located in the unsupported area, that is, a middle area of the arc-shaped corner area, and the cross section of the reinforcement block is in a uniform saw-toothed shape 3501. Surfaces of the reinforcement block, which are in contact with the encapsulation cover plate and the array substrate, are uniformly distributed in the unsupported area, which improves the stability of support, and the uniform saw-toothed shape further improves the uniformity of support of the reinforcement block.

When there is a cutting error, as the saw-toothed structure is provided, the probability of cutting the main body of the reinforcement block is reduced. In this case, the saw-toothed area at the edge of the reinforcement block becomes the stress concentration area, which can effectively prevent the body of the reinforcement block from cracking due to the cutting error, and avoid affecting the structural stability of the display panel. Moreover, even if the cutting error exists, the contact surfaces of the cut reinforcement block, which are in contact with the encapsulation cover plate and the array substrate, are still relatively uniform. In an embodiment, the cross section of the reinforcement block is in a non-uniform saw-toothed shape. For example, a distribution density of the saw teeth proximate to the edge of the display panel is less than a distribution density of the saw teeth proximate to the arc-shaped corner. Or a sharp angle of each protruding saw tooth proximate to the edge of the display panel, is less than a sharp angle of each protruding saw tooth proximate to the arc-shaped corner of the encapsulation layer, thereby further reducing the effect of the cutting error.

In an embodiment, the cross section of the reinforcement block can be in a regular stepped shape, and the cross-sectional outline of the reinforcement block can also include various shapes. For example, in order to increase a support area, the reinforcement block has a saw-toothed outline at one side away from the arc-shaped corner, and has an arc-shaped outline at another side proximate to the arc-shaped corner. That is, the protruding part of the reinforcement block is located on the other side proximate to the edges of the display panel. When the arc-shaped outline of the reinforcement block has a same or similar curvature as the arc-shaped corner of the encapsulation layer, the reinforcement block can be arranged to better fit the arc-shaped corner of the encapsulation layer, thus increasing an area for arranging the reinforcement block, and improving support stability.

Figure 5:
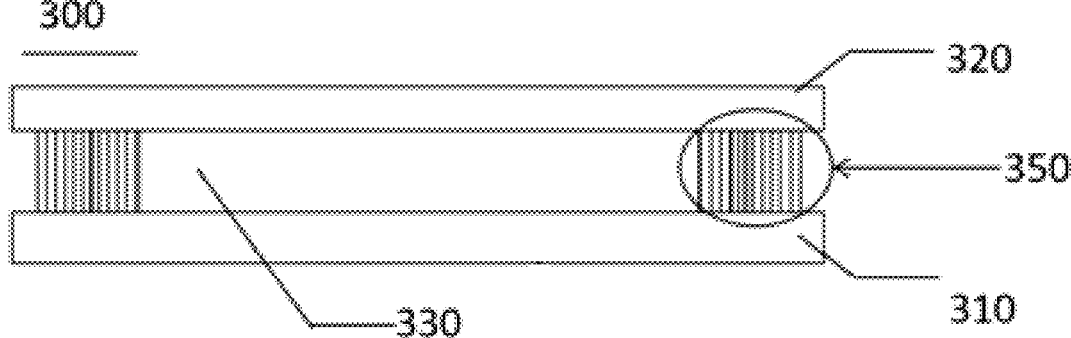
FIG. 5 is a schematic front view illustrating the structure of the display panel according to an embodiment of the present application.

FIG. 5 is a schematic front view illustrating the structure of the display panel 300 shown in FIG. 3. The reinforcement component 350 is disposed between the array substrate 310 and the encapsulation cover plate 320; an upper surface of the reinforcement component 350 is in contact with the encapsulation cover plate 320; and a lower surface of the reinforcement component 350 is in contact with the array substrate 310. The reinforcement component 350 plays the function of supporting and improves the intensity of the display panel 300. The reinforcement component 350 is disposed at an outer side of the encapsulation structure, that is, the reinforcement component 350 is arranged away from the active area. However, in the front view, the reinforcement component 350 and the encapsulation layer 330 have an overlapping area, which is the arc-shaped corner area of the encapsulation layer.

Figure 6:
FIG. 6 is a schematic top view illustrating the structure of the display panel according to an embodiment of the present application.
Figure 6:
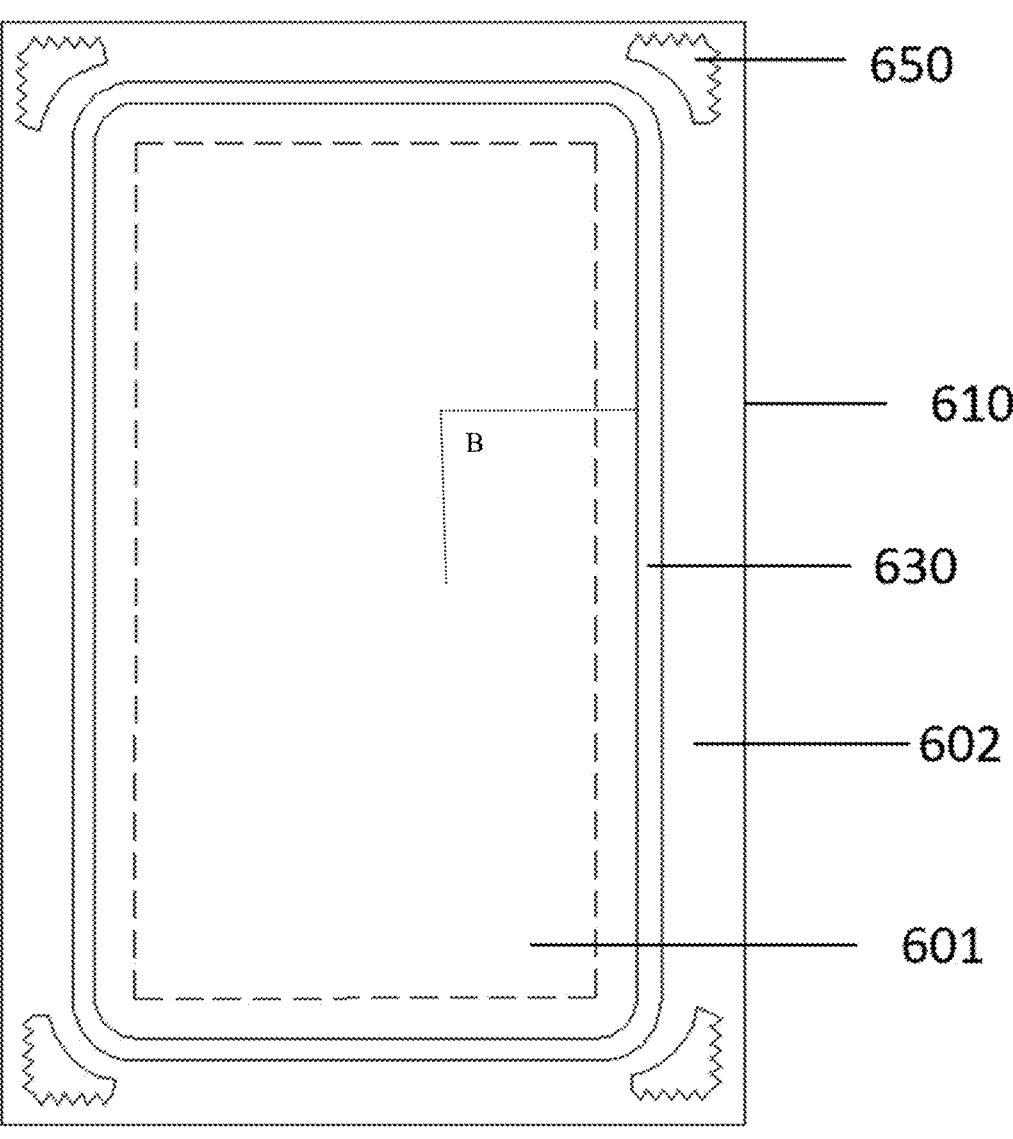
Figure 7:
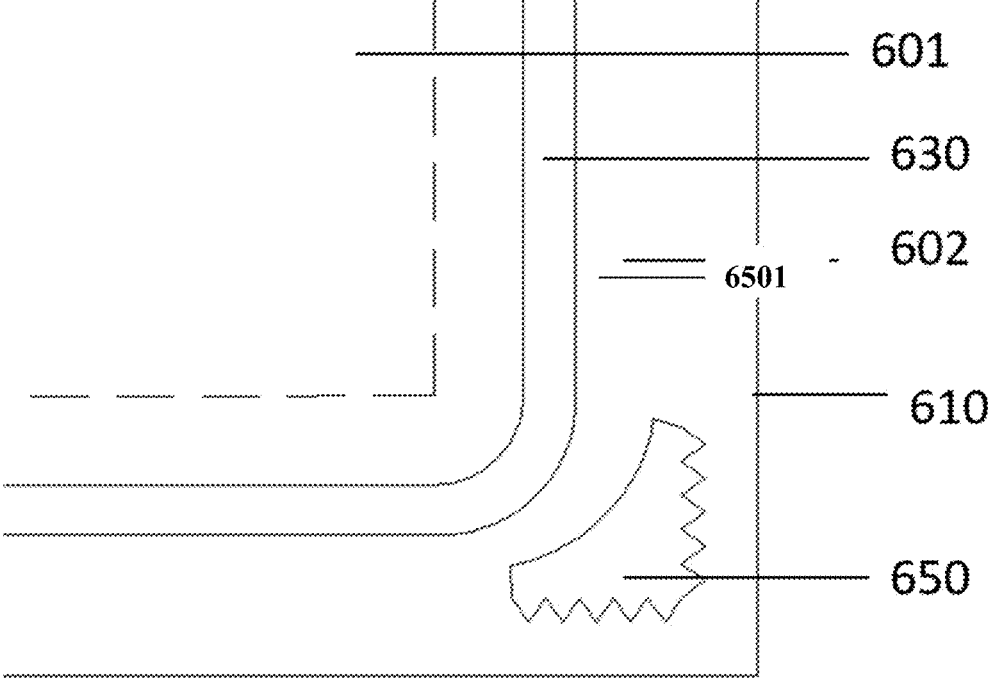
FIG. 7 is a partially enlarged schematic diagram illustrating the structure of the region B of the display panel in FIG. 6 according to an embodiment of the present application.

FIG. 6 is a schematic top view illustrating the structure of the display panel according to an embodiment of the present application. In this embodiment, the display panel 600 includes an array substrate 610, an encapsulation cover plate (not shown in the figure), and an encapsulation layer 630. Each arc-shaped corner area is provided with a reinforcement component 650, and the reinforcement component 650 is a single reinforcement block. In this embodiment, each arc-shaped corner area is provided with reinforcement component 650, and the reinforcement component is a single reinforcement block. FIG. 7 is a partially enlarged schematic diagram illustrating the structure of region B in FIG. 6. In this embodiment, one side of the reinforcement block, which is away from the arc-shaped corner, has a cross-sectional outline of a saw-toothed shape 6501; another side of the reinforcement block, which is proximate to the arc-shaped corner, has a cross-sectional outline of an arc. The arc-shaped structure can better fit the shape of the arc-shaped corner, thus occupying a larger support area; and the structure of the saw-toothed shape can reduce probability of cracks in the reinforcement component caused by the cutting error, thus enhancing the reliability of the display panel.

In other embodiments, the cross section of the reinforcement component can be a polygon or a smooth curved surface, such as a triangle, a rectangle, an ellipse, or a circle. That is, the reinforcement component has a regular structure such as a prism, a cylinder, an elliptic cylinder, etc., which improves the intensity of the display panel and reduces process difficulty as well.

In an embodiment, the reinforcement component includes a plurality of reinforcement blocks. The reinforcement blocks can be uniformly arranged in the arc-shaped corner area, and the uniform arrangement of the multiple reinforcement blocks can make a stable support structure to be formed in the arc-shaped corner area of the display panel, and uniformly arranged multiple reinforcement blocks can achieve the effect of distributing forces uniformly. The cross-sectional shape of each of the reinforcement blocks can be a regular polygon, such as a rectangle, a pentagon, and the like, and can also be a circle or an ellipse. The regular structures of the reinforcement blocks can reduce the process difficulty and design difficulty of the arrangement between the reinforcement blocks.

Figure 8:
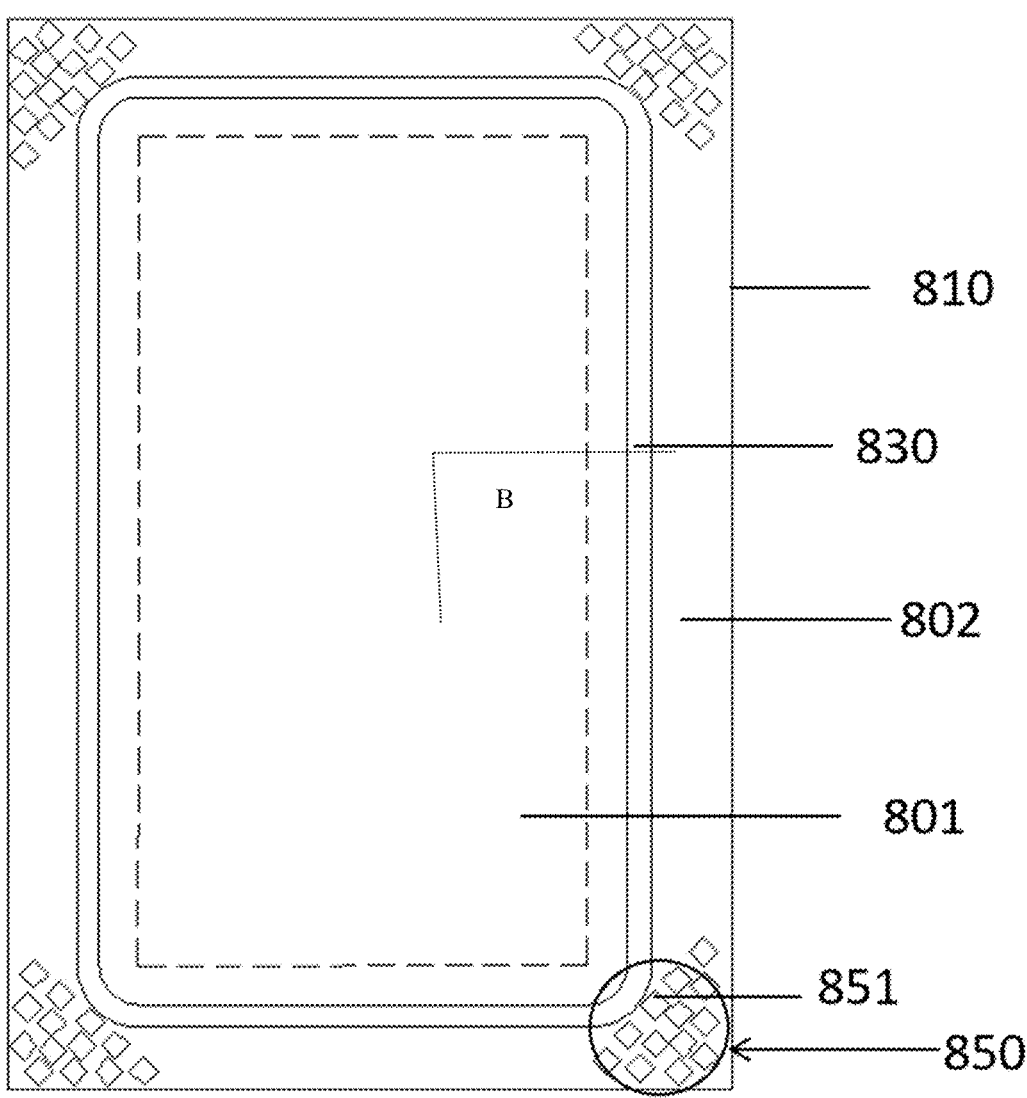
FIG. 8 is a schematic top view illustrating the structure of the display panel according to an embodiment of the present application.

FIG. 8 is a schematic top view illustrating the structure of the display panel according to an embodiment of the present application. In this embodiment, the display panel 800 includes an array substrate 810, an encapsulation cover plate (not shown in the figure) and an encapsulation layer 830; each of arc-shaped corner areas is provided with a reinforcement component 850; and the reinforcement component 850 includes a plurality of reinforcement blocks 851. In this embodiment, each of the arc-shaped corner areas is provided with a reinforcement component 850.

Figure 9:
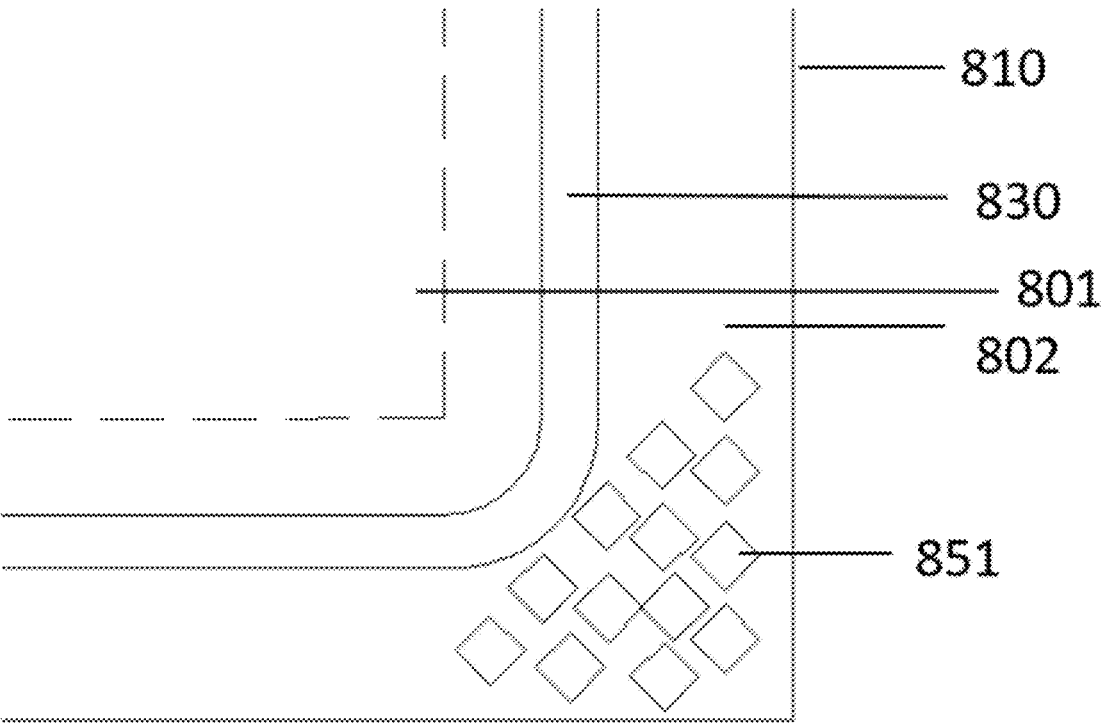
FIG. 9 is a partially enlarged schematic diagram illustrating the structure of the region B of the display panel in FIG. 8 according to an embodiment of the present application.

FIG. 9 is a partially enlarged schematic diagram of a region B in FIG. 8. In this embodiment, the display panel includes the reinforcement component 850, which includes the plurality of identical reinforcement blocks 851. The cross-section of each of the reinforcement blocks 851 is in a shape of square, and the reinforcement blocks 851 are uniformly distributed in the unsupported area corresponding to the arc-shaped corner area between the array substrate 810 and the encapsulation cover plate 820. The cross section of the reinforcement block 851 is in a shape of a square, that is, the reinforcement block 851 is a right square prism, which can reduce process complexity. The uniformly arranged reinforcement blocks have the effect of distributing the forces uniformly. It can be understood that, from the top view, the arc-shaped corner area in the embodiment of the present application includes arc-shaped edges and right-angled edges, and the outline of the entire area is irregular. Therefore, the uniform distribution mentioned in this application means that the plurality of reinforcement blocks 851 are uniformly distributed in the arc-shaped corner area. From the view of a projection, the uniform distribution prevents the reinforcement blocks 851 from being distributed too densely in some areas, while scattered or not arranged in other areas. Therefore, the uniform distribution mentioned in the present application does not mean that the reinforcement blocks are equally spaced.

Further, a corner of the reinforcement block 851 in this embodiment faces the edge of the display panel, that is, an edge of the reinforcement block 851 is prevented from being parallel to the edge of the display panel. In this case, the corner of the reinforcement block 851 is relatively closer to a cutting route, thus reducing the risk of occurring of cutting cracks when there is an error in the cutting process. Under the condition that no extra protruding or sharp-cornered structures are necessarily provided, the effects of a simple process, stable support, and a low risk of occurring of cutting cracks can be achieved only by arranging regular polygons, namely arranging the reinforcement blocks with a regular prism shape.

In this embodiment, as shown in the figures, one side of the square is directly opposite to the corner of the display panel, that is, one diagonal of the square is parallel to one edge of the corner of the display panel. In other embodiments, in order to reduce the risk of occurring of cracks caused by the cutting error, the reinforcement blocks can be provided in other ways, as long as the sides of the polygon are avoided being parallel to the edges of the display panel. Compared with that in the case that the side of the polygon is not parallel to the edge of the display panel, in order to reduce the risk of occurring of cracks caused by the cutting error, the reinforcement block, in the case that the side of the polygon is parallel to the edge of the display panel, can be arranged to be closer to an inner side relative to the edges of the display panel.

The display panel provided by embodiments of the present application includes the array substrate 110, 210, 310, 610, 810, the encapsulation cover plate 120, 320, the encapsulation layer 130, 230, 330, 630, 830, and a reinforcement component 350, 650, 850. The array substrate includes the active area 201, 301, 601, 801 and the non-active area 202, 302, 602, 802 surrounding the active area, and the encapsulation layer is disposed between the array substrate and the encapsulation cover plate and in the non-active area. The encapsulation layer includes the arc-shaped corner; the reinforcement component is disposed between the array substrate and the encapsulation cover plate, and the reinforcement component is disposed at a side of the arc-shaped corner, which is away from the active area, namely, the arc-shaped corner area 203 is provided with the reinforcement component.

The display panel provided by this application can be manufactured by adopting related technologies. The encapsulation layer and the reinforcement component can be manufactured by adopting screen printing technology. The reinforcement component and the encapsulation layer can be made of the same material to simplify the process. The encapsulation layer can be common glass powder material, such as V2O5, P2O5, BaO, Be2O3, SnO, or the like. The Frit encapsulation materials usually include glass powder, solvents, a filler, and an adhesive. The solvent can include at least one of alcohol and ester; the filler can include ceramic; and the binder can include at least one of ethyl cellulose, acrylic ester, and so on. The encapsulation material and the reinforcement component described in this application can be the Frit encapsulation materials in related technologies.

This application provides a method for manufacturing a display panel, comprising:

S1, coating an encapsulation material on an encapsulation cover plate and forming an encapsulation layer and a reinforcement component described in this application;

S2, bonding the encapsulation cover plate and the array substrate;

S3, irradiating the encapsulation layer by a laser.

Specifically, the encapsulation layer and the reinforcement component in the manufacturing method described in the present application can be manufactured by adopting the screen printing technology in the related technologies. In the related technologies, the screen includes a pattern area and a non-pattern area. The pattern area corresponds to the encapsulation structure. The pattern area corresponding to the encapsulation layer structure is formed by adopting the screen printing technology, and the non-pattern area is filled with latex. Because there is only a screen but no latex in the pattern area, a printing paste can penetrate the screen and be transferred onto the substrate. Specifically, after the Frit mask tension, under a force of forwarding movement and a downward force, a scraper drives the paste to move along a horizontal direction. At this time, the screen is in contact with the encapsulation cover plate; when the paste moves to the pattern area, the paste is filled into meshes of the screen; after the scraper leaves, under stretching forces of the screen itself, the screen is separated from the encapsulation cover plate, and the paste is transferred from an opening pattern on the screen to the encapsulation cover plate to form a preset encapsulation pattern.

In addition to the encapsulation layer pattern, the pattern area of the screen of this application also includes a pattern of the reinforcement component, that is, the pattern area of the application includes the pattern area corresponding to the encapsulation layer and the reinforcement component, and the pattern corresponding to the reinforcement component can also be achieved by a method in related technologies. That is, no latex is filled in the screen area corresponding to the reinforcement component, so that at the position of the corresponding reinforcement component, the printing paste can penetrate the screen and be transferred onto the substrate. The reinforcement component and the encapsulation layer have the same height.

In the display panel manufactured by the method described in this application, the reinforcement component further improves the intensity of the display panel, and the reinforcement component can be manufactured by using related technologies. The reinforcement component can be manufactured by the same process as the material of the encapsulation layer is manufactured, and the process is simple and easy to implement.

In addition, in the present application, the reinforcement component structure is formed without a sealing process, that is, the newly-provided reinforcement component for the Frit encapsulation only take functions of supporting but not sealing, so the reinforcement component needs not to be sealed by laser, nor needs to be manufactured by a corresponding sealing process, thereby further reducing the difficulty and complexity of the process.

The display panel manufacture method described in this application adopts the screen printing technology, and the reinforcement component can be manufactured only by changing the screen pattern area. Moreover, the structure of the reinforcement component needs not to be sealed by laser, thereby further reducing the complexity of the process.

It should be understood that although this specification is described in accordance with the embodiments, not each embodiment only contains one independent technical solution. The description of the specification is only for the sake of clarity. Those skilled in the art should regard the specification as a whole. The technical solutions in various embodiments can also be appropriately combined to form other embodiments that can be understood by those skilled in the art.

The above-mentioned embodiments are only some embodiments of the present application, and they are relatively specific and detailed, but should not be understood as a limitation to the patent scope of the present application. It should be mentioned that, for those of ordinary skill in the art, various modifications and improvements can be made without departing from the concept of this application, and these modifications and improvements all fall within the protection scope of this application. Therefore, the protection scope of this application should be subject to the appended claims.

What is claimed is:

1. A display panel, comprising:
an array substrate, comprising an active area and a non-active area surrounding the active area;
an encapsulation cover plate; an encapsulation layer, disposed between the array substrate and the encapsulation cover plate and disposed on the non-active area of the array substrate, the encapsulation layer comprising an arc-shaped corner; and
a reinforcement component, disposed between the array substrate and the encapsulation cover plate;
wherein an arc-shaped corner area is defined between the array substrate and the encapsulation cover plate, and corresponds to one side of the arc-shaped corner of the encapsulation layer, and the one side of the arc-shaped corner is away from the active area; a circle center of the arc-shaped corner is located at another side of the arc-shaped corner adjacent to the active area;
the array substrate and the encapsulation cover plate each comprise a non-arc-shaped corner in the arc-shaped corner area;
a first distance (d1) between the arc-shaped corner of the encapsulation layer and an edge of the array substrate in the arc-shaped corner area is greater than a second distance (d2) between a straight-edge of the encapsulation layer and an edge of the array substrate adjacent to the straight-edge of the encapsulation layer; and
a gap is formed between the reinforcement component and the arc-shaped corner of the encapsulation layer, and the reinforcement component is a single reinforcement block and located in a central region of the arc-shaped corner area;
a cross section of the reinforcement component is in a saw-toothed shape having a plurality of protruding saw teeth, and a sharp angle formed by two edges of each protruding saw tooth proximate to an edge of the display panel is less than a sharp angle formed by two edges of each protruding saw tooth proximate to the arc-shaped corner of the encapsulation layer.

2. The display panel according to claim 1, wherein a material of the encapsulation layer is identical to a material of the reinforcement component.

3. The display panel according to claim 1, wherein a height of the reinforcement component is a height between the array substrate and the encapsulation cover plate after encapsulation.

4. The display panel according to claim 1, wherein the reinforcement component has an upper surface in contact with the encapsulation cover plate and a lower surface in contact with the array substrate.

5. The display panel according to claim 1, wherein multiple arc-shaped corners are provided; wherein one reinforcement component is disposed at one side of each arc-shaped corner; and wherein the side of each arc-shaped corner is away from the active area.

6. The display panel according to claim 1, wherein multiple arc-shaped corners are provided; wherein reinforcement components are disposed at sides of symmetrical arc-shaped corners; and wherein the sides of the symmetrical arc-shaped corners are away from the active area.

7. The display panel according to claim 1, wherein a side surface of the reinforcement component has a protruding portion; wherein an upper surface of the protruding portion is a part of an upper surface of the reinforcement component; and wherein a lower surface of the protruding portion is a part of a lower surface of the reinforcement component.

8. A display panel, comprising:
an array substrate, comprising an active area and a non-active area surrounding the active area;
an encapsulation cover plate;
an encapsulation layer, disposed between the array substrate and the encapsulation cover plate and disposed on the non-active area of the array substrate, the encapsulation layer comprising an arc-shaped corner; and
a reinforcement component, disposed between the array substrate and the encapsulation cover plate; wherein an arc-shaped corner area is defined between the array substrate and the encapsulation cover plate, and corresponds to one side of the arc-shaped corner of the encapsulation layer, and the one side of the arc-shaped corner is away from the active area; a circle center of the arc-shaped corner is located at another side of the arc-shaped corner adjacent to the active area;

the array substrate and the encapsulation cover plate each comprise a non-arc-shaped corner in the arc-shaped corner area; a first distance (d1) between the arc-shaped corner of the encapsulation layer and an edge of the array substrate in the arc-shaped corner area is greater than a second distance (d2) between a straight-edge of the encapsulation layer and an edge of the array substrate adjacent to the straight-edge of the encapsulation layer;

a gap is formed between the reinforcement component and the arc-shaped corner of the encapsulation layer, and the reinforcement component is a single reinforcement block and located in a central region of the arc-shaped corner area;

a cross section of the reinforcement component is in a saw-toothed shape having a plurality of saw teeth with the same geometry; and a distribution density of saw teeth proximate to an edge of the display panel is less than a distribution density of saw teeth proximate to the arc-shaped corner of the encapsulation layer.

9. The display panel according to claim 8, wherein a material of the encapsulation layer is identical to a material of the reinforcement component.

10. The display panel according to claim 8, wherein a height of the reinforcement component is a height between the array substrate and the encapsulation cover plate after encapsulation.

11. The display panel according to claim 8, wherein the reinforcement component has an upper surface in contact with the encapsulation cover plate and a lower surface in contact with the array substrate.

12. The display panel according to claim 8, wherein multiple arc-shaped corners are provided; wherein one reinforcement component is disposed at one side of each arc-shaped corner; and wherein the side of each arc-shaped corner is away from the active area.

13. The display panel according to claim 8, wherein multiple arc-shaped corners are provided; wherein reinforcement components are disposed at sides of symmetrical arc-shaped corners; and wherein the sides of the symmetrical arc-shaped corners are away from the active area.

14. The display panel according to claim 8, wherein a side surface of the reinforcement component has a protruding portion; wherein an upper surface of the protruding portion is a part of an upper surface of the reinforcement component; and wherein a lower surface of the protruding portion is a part of a lower surface of the reinforcement component.

* * * * *